United States Patent
Hara et al.

Patent Number: 5,206,685
Date of Patent: Apr. 27, 1993

[54] APPARATUS FOR MAINTAINING AN ELECTROPHOTOGRAPHIC APPARATUS

[75] Inventors: Kei Hara; Koki Tanaka, both of Shizuoka, Japan

[73] Assignee: Tokyo Electric Co., Ltd., Tokyo, Japan

[21] Appl. No.: 854,417

[22] Filed: Mar. 19, 1992

[30] Foreign Application Priority Data

Mar. 29, 1991 [JP] Japan .................................. 3-89082
Jun. 27, 1991 [JP] Japan ................................. 3-156623
Sep. 18, 1991 [JP] Japan ................................. 3-265392

[51] Int. Cl.⁵ .............................................. G03G 15/00
[52] U.S. Cl. ................................... 355/206; 355/308
[58] Field of Search ............................... 355/203-209, 355/308, 211

[56] References Cited

U.S. PATENT DOCUMENTS 4,551,000 11/1985 Kanemitsu et al. .............. 355/210
4,851,875 7/1989 Tanimoto ....................... 355/211 X

FOREIGN PATENT DOCUMENTS 57-163276 10/1982 Japan .
60-136757 7/1985 Japan .............................. 355/206
62-75468 4/1987 Japan .
2-559 1/1990 Japan .

Primary Examiner—Joan H. Pendegrass
Attorney, Agent, or Firm—Frishauf, Holtz, Goodman & Woodward

[57] ABSTRACT

An apparatus for maintaining an electrophotographic apparatus with at least a photosensitive member comprises a first memory for storing a count value for the number of prints, and a second memory for storing the number of replacements of the first memory when the count value for the number of prints has reached a value based on which a decision is made whether the service life of the photosensitive member is expired. When it is determined that the value stored in the second memory has reached a predetermined value, a user is informed of the maintenance period of other maintenance-requiring components than the photosensitive member.

5 Claims, 12 Drawing Sheets

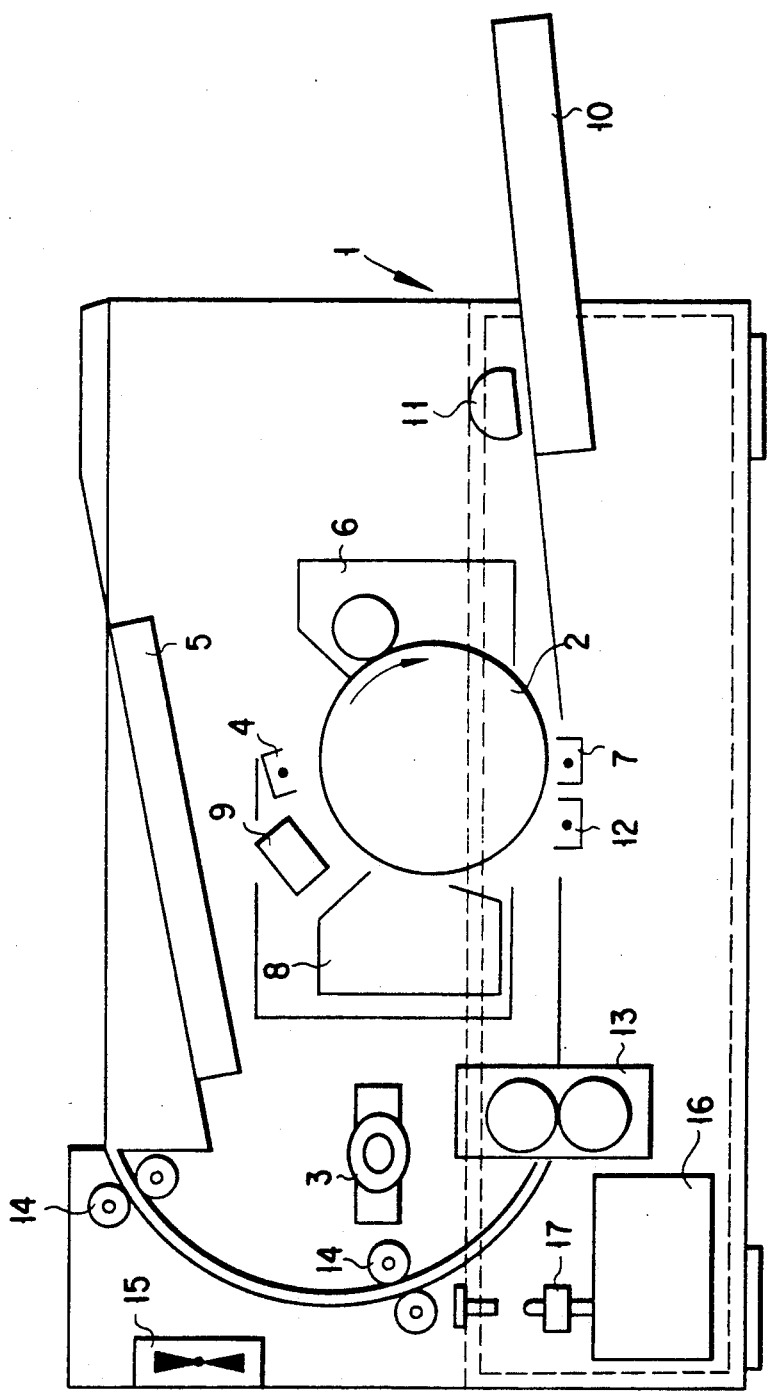
F I G. 1

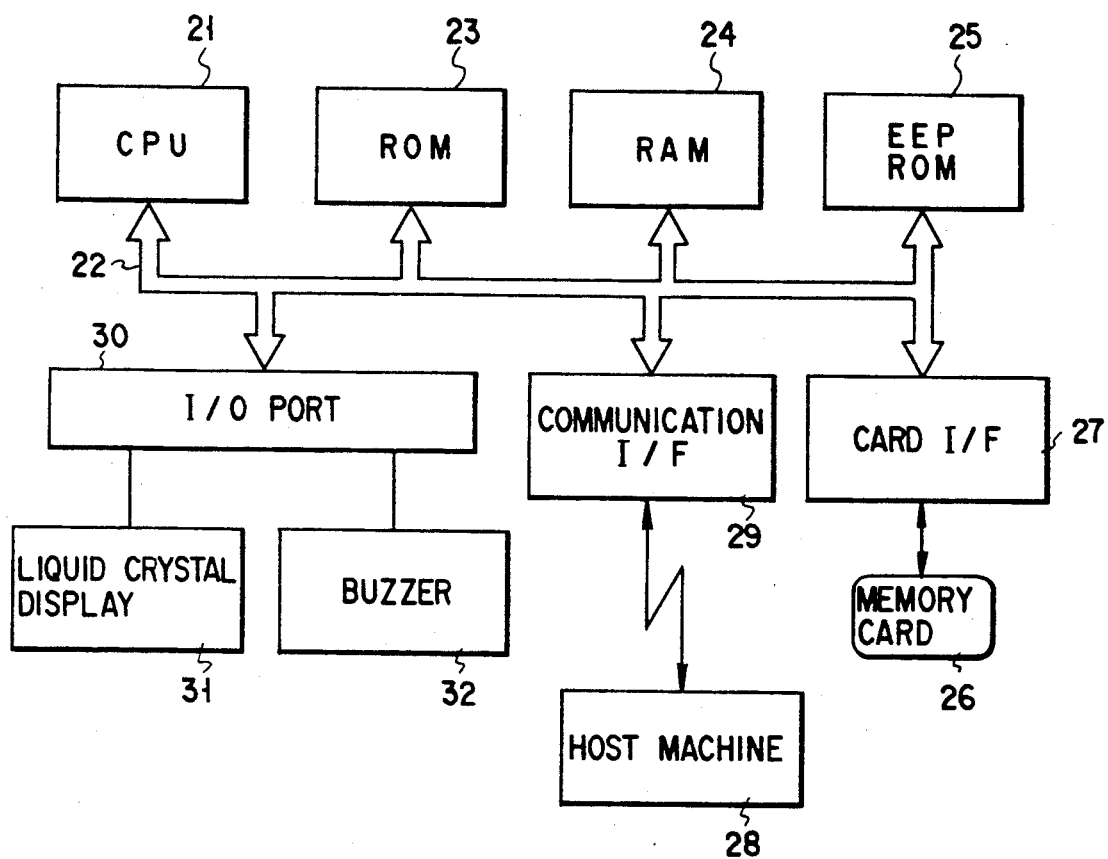
F I G. 2

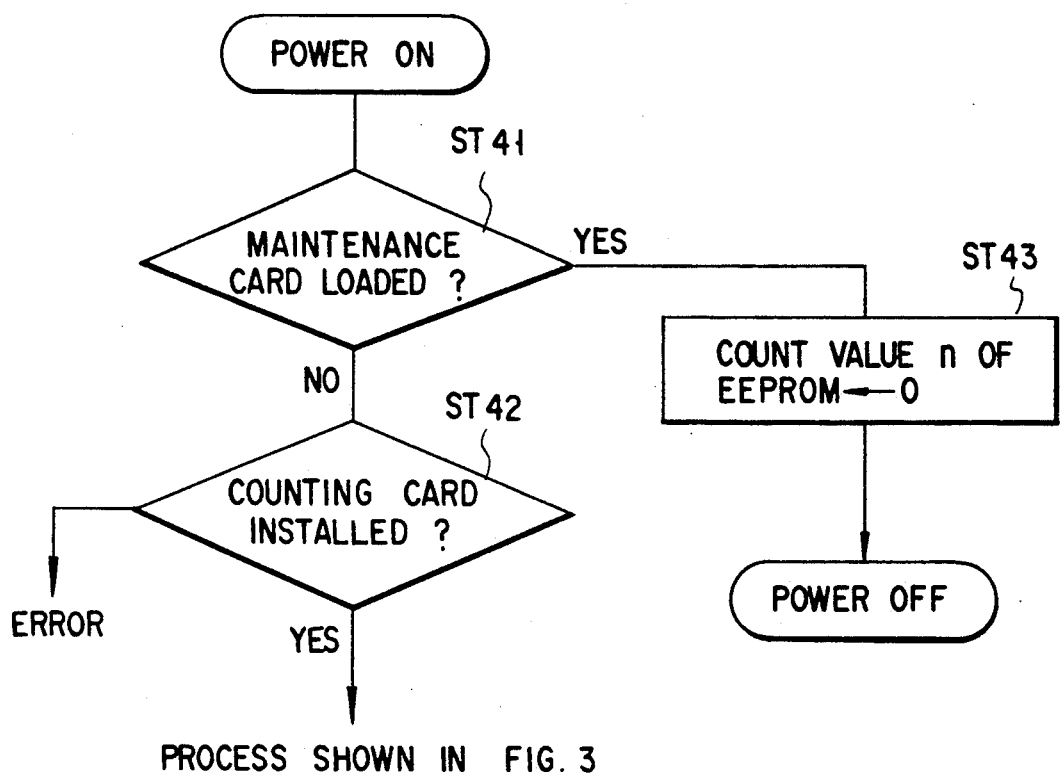
F I G. 7

APPARATUS FOR MAINTAINING AN ELECTROPHOTOGRAPHIC APPARATUS

BACKGROUND OF THE INVENTION

1. Field of the Invention

The present invention relates to an apparatus for maintaining an electrophotographic apparatus having at least a photosensitive member, which can ensure automatic maintenance of those components excluding the photosensitive member that need maintenance.

2. Description of the Related Art

An electrophotographic apparatus exposes an electrified photosensitive member to form an electrostatic latent image thereon, develops the image using a developer, such as a toner, and transfers the toner image to a recording medium, forming an image thereon. The photosensitive member will be worn out by the repetitive exposure on a photosensitive material constituting the photosensitive member, or by its contacting ozone which is generated through the discharging of a discharger for electrification. The photosensitive member is therefore treated as a consumable component, and have to be replaced with new one if the photosensitive member becomes worn out to deteriorate the image.

Attention is paid to the number of printed recording media (e.g. the number of printed sheets) as information about the service life of the photosensitive member. A printer employing a conventional electrophotographic method therefore counts the number of prints by a paper counter using a nonvolatile memory device, detects that a count value has reached a predetermined value and displays information to this effect, informing a user of the need for replacement of the photosensitive member (see Published Unexamined Japanese patent Application No. 62-75468).

Since the paper counter is replaced with another at the time of the replacement of the photosensitive member, the paper counter is reset upon each replacement of the photosensitive member. With this paper counter, the total print number since the electrophotographic apparatus was first used cannot be counted. A mechanical counter for counting the total number of prints is therefore provided besides the paper counter to supervise maintenance periods of components in the electrophotographic apparatus other than the photosensitive member, which have a comparatively long service life, such as an electrifying section, a developing unit, a transfer section and deelectrifying section.

As described above, a conventional electrophotographic apparatus of this type can automatically check the service life of a photosensitive member, but cannot automatically manage the maintenance periods of consumable components other than the photosensitive member, so that a user has to check these periods referring to the total number of prints counted by a mechanical counter. Accordingly, the user has to always grasp the relation between the total print number and the service lives of the individual consumable components for the maintenance of these components, is therefore burdened with much work.

SUMMARY OF THE INVENTION

It is therefore an object of the present invention to provide an apparatus for maintaining an electrophotographic apparatus with at least a photosensitive member, which has a simple and inexpensive structure to be able to automatically check the service lives of consumable components that are longer than the service life of the photosensitive member to prevent a malfunction of the electrophotographic apparatus or degradation of the image quality due to the expiration of the service lives without troubling a user, thereby increasing the reliability of the maintaining apparatus.

To achieve the above object, an apparatus for maintaining an electrophotographic apparatus with at least a photosensitive member according to the present invention comprises a central processing unit (CPU) constituting a control section; memory mean provided detachable for storing a count value for the number of prints; rewritable non-volatile memory element for storing the number of replacements of the memory means when the count value for the number of prints has reached a value based on which a decision is made whether a service life of the photosensitive member is expired; memory-means replacement counting means for updating a stored value in the non-volatile memory element and counting an updated value upon each replacement of the memory means; comparing means for comparing a count value of the replacement counting means with a predetermined value indicating a maintenance period of other components than the photosensitive member that need maintenance; and informing means for reporting the need for maintenance of the other components than the photosensitive member when it is judged that a value stored in the non-volatile memory element has reached the predetermined value.

The apparatus for maintaining an electrophotographic apparatus with at least a photosensitive member according to the present invention has a simpler and inexpensive structure and can automatically inspect maintenance periods of maintenance-requiring components that are longer than the life of the photosensitive member, to thereby surely prevent a malfunction of the electrophotographic apparatus or degradation of the image quality due to the expiration of the service lives without troubling a user, thus increasing the reliability of the maintaining apparatus.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a schematic diagram illustrating the structure of a non-impact printer that is the target for maintenance by an apparatus for maintaining an electrophotographic apparatus according to the present invention;

FIG. 2 is a block diagram illustrating the hardware structure of the essential portions of the apparatus for maintaining the non-impact printer shown in FIG. 1;

FIG. 3 is a flowchart showing a preprocess after a CPU in the block circuit shown in FIG. 2 is power on;

FIG. 7 is a flowchart showing a preprocess after a CPU in the block circuit shown in FIG. 6 is powered on;

FIG. 10 is a flowchart showing a process of the laser printer shown in FIG. 8 after powered on;

DETAILED DESCRIPTION OF THE PREFERRED EMBODIMENTS

Figure 3:
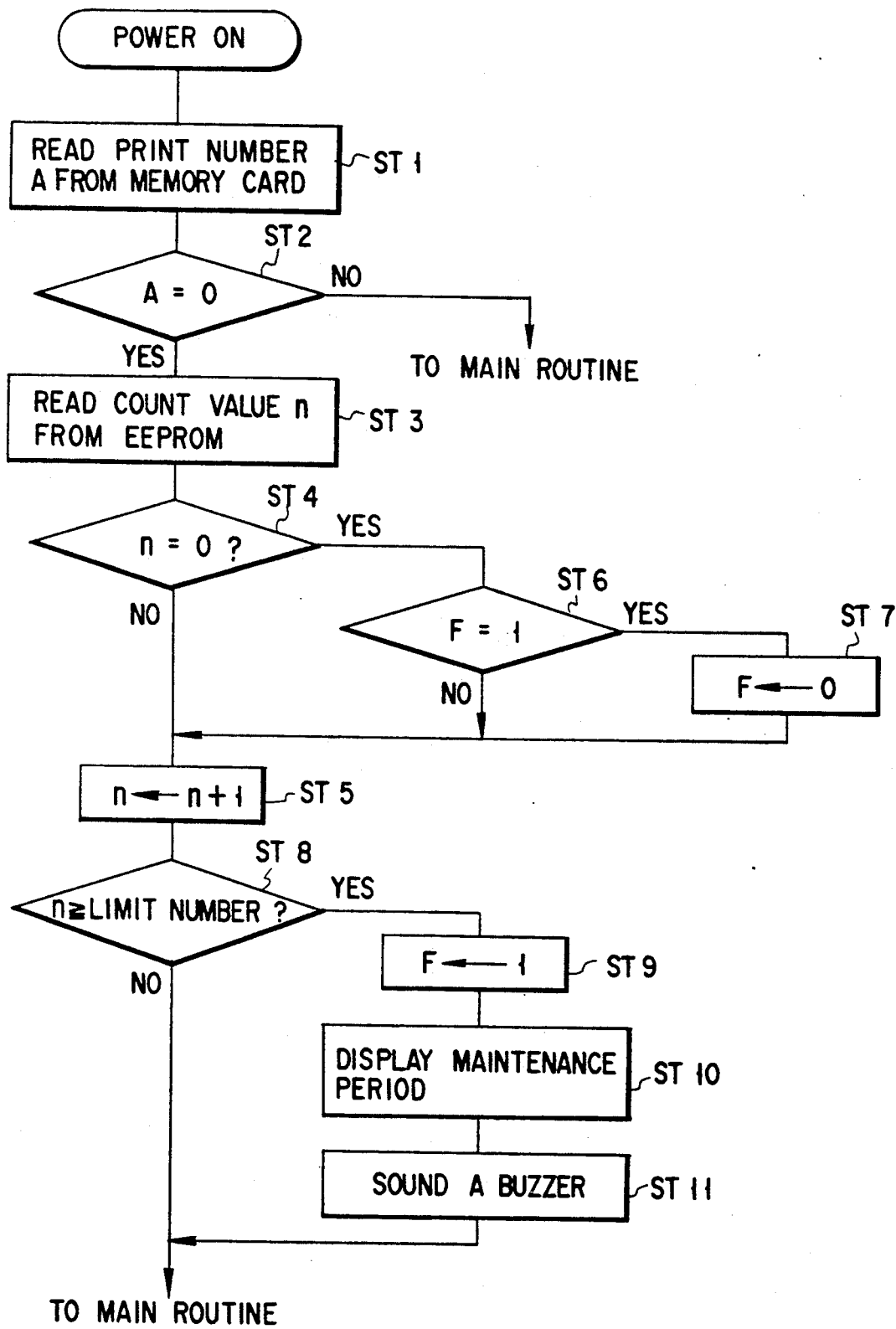

An apparatus for maintaining an electrophotographic apparatus with at least a photosensitive member according to one preferred embodiment of the present invention will now be described referring to the accompanying drawings.

FIG. 1 shows the schematic structure of a non-impact printer as an electrophotographic apparatus. A photosensitive drum 2 is located in the almost center portion of a printer cabinet 1, which has one side end supported rotatable and other end side separable into upper and lower parts. The photosensitive drum 2 is rotated by a drive motor 3 in one direction, i.e., clockwise as indicated by an arrow in FIG. 1. Arranged around the photosensitive drum 2 are an electrification charger 4, an exposing unit 5, a developing unit 6, a transfer charger 7, a cleaning unit 8, and a deelectrification charger 9 in the named order along an electrophotographic process. The electrification charger 4 electrifies the surface of the photosensitive drum 2 or a photosensitive member. The exposing unit 5 radiates light on the photosensitive drum 2 which is electrified by the electrification charger 4, exposing the photosensitive drum 2 to record information thereon. The developing unit 6 permits a toner as a developer to stick to the photosensitive drum 2 exposed by the exposing unit 5. The transfer charger 7 transfers a toner image on the photosensitive drum 2 onto a sheet of paper that has been fed thereto. The cleaning unit 8 cleans the residual toner off from the photosensitive drum 2. The deelectrification charger 9 deelectrifies the photosensitive drum 2.

The transfer charger 7 is located below the photosensitive drum 2. Sheets of paper are picked up one by one by a pickup roller 11 and fed from a paper supply cassette 10 provided on one side of the printer cabinet 1 to the transfer charger 7 at a predetermined timing.

After the transfer charger 7 transfers the toner image from the photosensitive drum 2 to a supplied sheet of paper, the deelectrification charger 12 deelectrifies the paper, and further a fixing unit 13 fixes the toner image on the paper. The sheet of paper after the fixation is discharged from the printer cabinet 1 by discharge rollers 14.

In this process, the drive motor 3 that drives the photosensitive drum 2 also serves as a driving source for a sheet-feeding mechanism.

In this printer cabinet 1 are further provided a fan 15 which releases internal heat outside, a power supply 16, a cover switch 17 which detects that the printer cabinet 1 is separated into upper and lower parts, and turns the power off.

FIG. 2 is a block diagram showing the circuit structure of essential portions of the non-impact printer. A CPU (Central Processing Unit) 21, serving as a main control section, is connected to a ROM (Read Only Memory) 23, a RAM (Random Access Memory) 24, an EEPROM (Electrically Erasable and Programmable Read Only Memory) 25, a card interface 27, a communication interface 29 and an I/O port 30 by means of a bus line 22. The ROM 23 previously stores program data, etc. The RAM 24 provides a print buffer or the like for developing print data. The EEPROM 25 serves as a rewritable non-volatile memory element. The card interface 27 reads data from and writes data to a memory card 26 which is installed removable. The communication interface 29 exchanges data with a host machine 28 which outputs print data.

Connected to the I/O port 30 are a liquid crystal display 31 which can display various messages, a buzzer 32, etc.

The memory card 26 stores the count value of the prints as information about the service life of the photosensitive drum 2. The memory card 26 and the photosensitive drum 2 are replaced at the same time as a set.

The EEPROM 25 has an storage area for the number of replacements of the memory card 26.

The CPU 21 is so programmed as to execute a preprocess shown in FIG. 3 when power is turned on.

With power on, the CPU 21 controls the card interface 27 and reads data or print number A stored in the installed memory card 26 (ST1). When the print number A is greater than "0" (ST2), the photosensitive drum 2 and the memory card 26 have not been replaced and the print number A is still counted, so that the CPU 21 starts the main routine.

If the print number A is "0," this indicates that the photosensitive drum 2 and the memory card 26 have been replaced with new ones. The CPU 21 then reads data stored in the EEPROM 25, i.e., replacement number n of the memory card 26 (ST3). The read replacement number n is incremented by one, and the updated value is written as a current replacement number n to the EEPROM 25 (replacement counting means) (ST4 and ST5). The CPU 21 resets a limit flag F stored in RAM 24 to "0" only when the replace number n is "0" and that limit flag has been set to "1," indicating the completion of the maintenance.

Then the updated replacement number n is compared with a predetermined limit number of replacements, based on the maintenance periods of the maintenance-requiring components other than the photosensitive drum 2 (replacement comparing means) (ST8). In case of the replacement number n smaller than the limit number, the maintenance-requiring components do not need the maintenance yet. The main routine is therefore invoked.

If the replacement number n has reached the limit number, the CPU 21 sets the limit flag F of the RAM 24 to "1" (ST4), and permits the liquid crystal display 31 to display a message indicating the need for the maintenance of the maintenance-requiring components (ST10). The CPU 21 also gives a predetermined alarm sound by means of a buzzer 32 before starting the main routine (maintenance period informing means).

Figure 4:
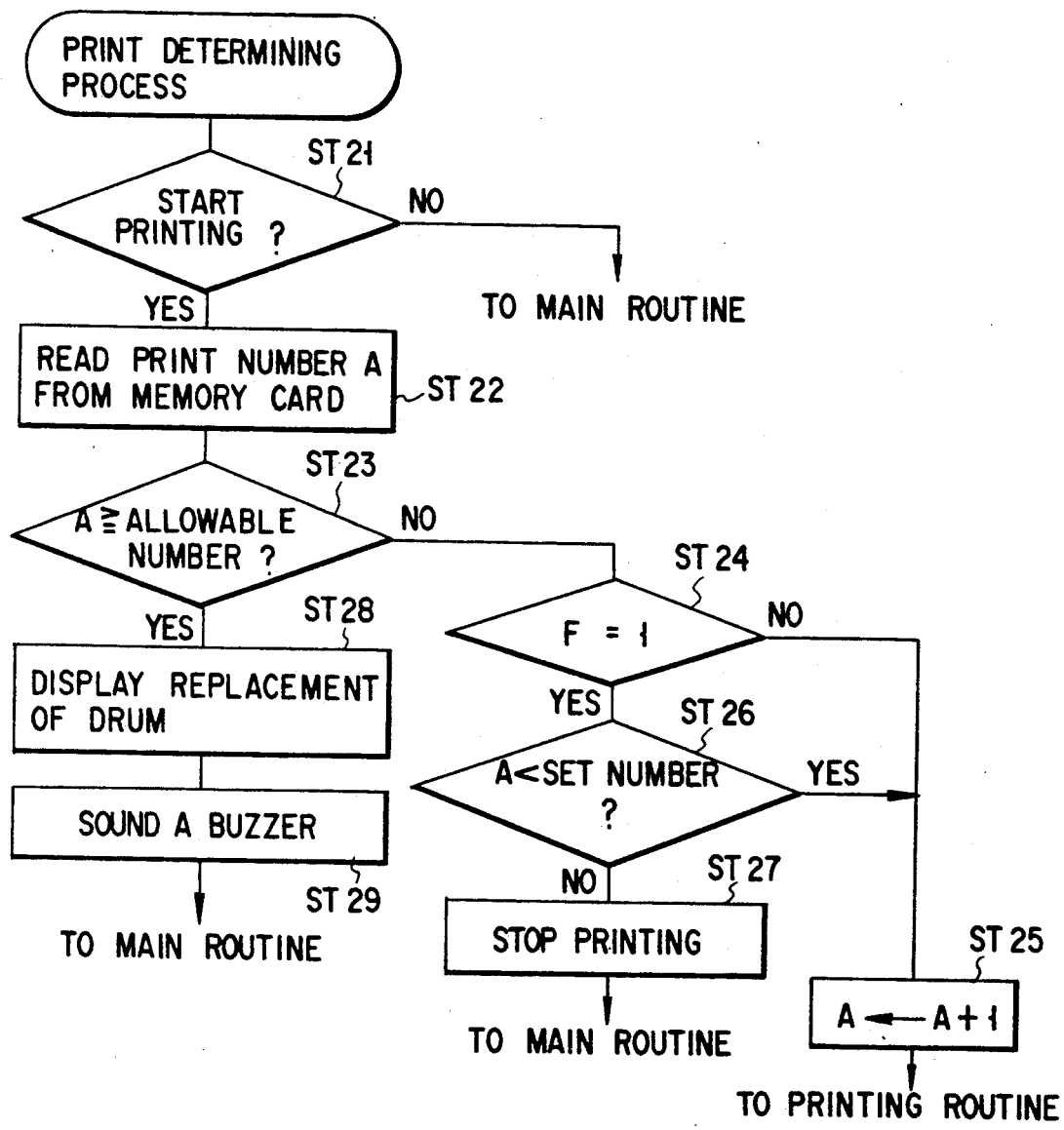
FIG. 4 is a flowchart showing a print determination process of the CPU in the block circuit shown in FIG. 2.

The CPU 21 is so programmed as to execute a print determining process shown in FIG. 4 in the main routine as needed.

In other words, at the timing for executing the print determining process, the CPU 21 first determines whether or not printing is ready to start. If the printing is not ready, the CPU 21 immediately returns to the main routine.

As shown in FIG. 2, when printing is ready by a printing command from the host machine 28, the CPU 21 controls the card interface 27 and reads the stored data of the installed memory card 26, i.e., the print number A (ST22). The CPU 21 then compares the print number A read from the memory card 26 with the allowable sheet number, which corresponds to the service life of the photosensitive drum 2 (ST23). The print number A, if smaller than the allowable sheet number, indicates that the service life of the photosensitive drum 2 is not yet expired, so that the CPU 21 checks the limit flag F in the RAM 24. If the limit flag F is reset at that time (ST24), the lives of the maintenance-requiring components except for the photosensitive drum 2 are not expired, either. The CPU 21 then increments the print number A by "1," and writes the updated value as a current print number A to the memory card 26 (ST25) before invoking a printing routine.

The CPU 21 operates not only the drive motor 3 but also the electrification charger 4, the exposing unit 5, the developing unit 6, the transfer charger 7, the deelectrification chargers 9 and 12 and the fixing unit 13 to print print data, sent from the host machine 28, on paper.

When the limit flag F is set, which means that the maintenance periods of the maintenance-requiring components are expired, the CPU 21 determines whether the print number A has reached a set number (ST26). In case of the print number A smaller than the set number, printing is still sufficiently possible. The print number A is incremented by "1," and the updated value is written as a current print number A to the memory card 26. The main routine is then started.

If the print number A has reached the set number, a malfunction might occur due to the expiration of the lives of the maintenance-requiring components. The CPU 21 then inhibits moving to the printing routine (ST27), and returns to the main routine.

The life of the photosensitive drum 2 is expired when the print number A read from the memory card has reached the allowable sheet number, and the liquid crystal display 31 displays a message indicating the need for the replacement of the photosensitive drum 2. The CPU 21 also causes the buzzer 32 to generate a predetermined alarm sound before returning to the main routine.

According to this embodiment with the above-described structure, the photosensitive drum 2 and the memory card 26 are treated as a set, and the memory card 26 stores the count value for the number of prints as information about the service life of the photosensitive drum 2. When the value stored in the memory card 26 becomes equal to an allowable sheet number (e.g., 10,000 sheets) corresponding to the service life of the photosensitive drum 2, a message indicating the need for the replacement of the photosensitive drum 2 is displayed on the liquid crystal display 31 (ST28) and an alarm sound is given from the buzzer 32 (ST29). The message and the alarm sound can inform a user of the expiration of the life of the photosensitive drum 2, so that the user has only to turn off the power, and open the printer cabinet 1 by lifting its upper part up to replace the photosensitive drum 2 and the memory card 26 with new ones.

After the replacement, the user turns on the power. Since the value A stored in the memory card 26 is "0," the value stored in the EEPROM 25 is incremented by "1." In other words, the EEPROM 25 counts the replacement number of the memory card 26.

If the replacement number of the memory card 26 has reached a number corresponding to the maintenance periods of the maintenance-requiring components except for the photosensitive drum 2, for example, eight times (80,000 printings in total), a message indicating the need for the maintenance of the maintenance-requiring components is displayed o the liquid crystal display 31, and an alarm sound is given by the buzzer 32. The message display and the sound inform the user of the arrival of the maintenance period of any component other than the photosensitive drum 2, such as the electrification charger 4, the developing unit 6, the transfer charger 7, or the deelectrification chargers 9 and 12, so that the user can ask a maintenance man or the like for maintenance of these components.

In this case printing can still be done properly without maintenance even if the maintenance period of a certain component has arrived. If, after expiration of the maintenance period, no maintenance is conducted and the number of prints exceeds a predetermined sheet number smaller than the allowable sheet number for the photosensitive drum 2, the maintenance-requiring components might malfunction depending on their service lives. In this embodiment, therefore, printing is inhibited when a value stored in the memory card 26 reaches the predetermined number while a value stored in the EEPROM 25 has reached the limit number. It is therefore possible to prevent a malfunction from occurring during printing due to the expiration of the service lives of the maintenance-requiring components.

According to this embodiment as described above, not only the service life of the photosensitive drum 2 but also the service lives of other maintenance-requiring components are automatically inspected, so that the malfunction due to the expiration of the service lives can be prevented without inconveniencing the user. Accordingly, it is possible to provide a non-impact printer which is highly reliable and very practical.

The present invention is not limited to the above-described embodiment.

Figure 5:
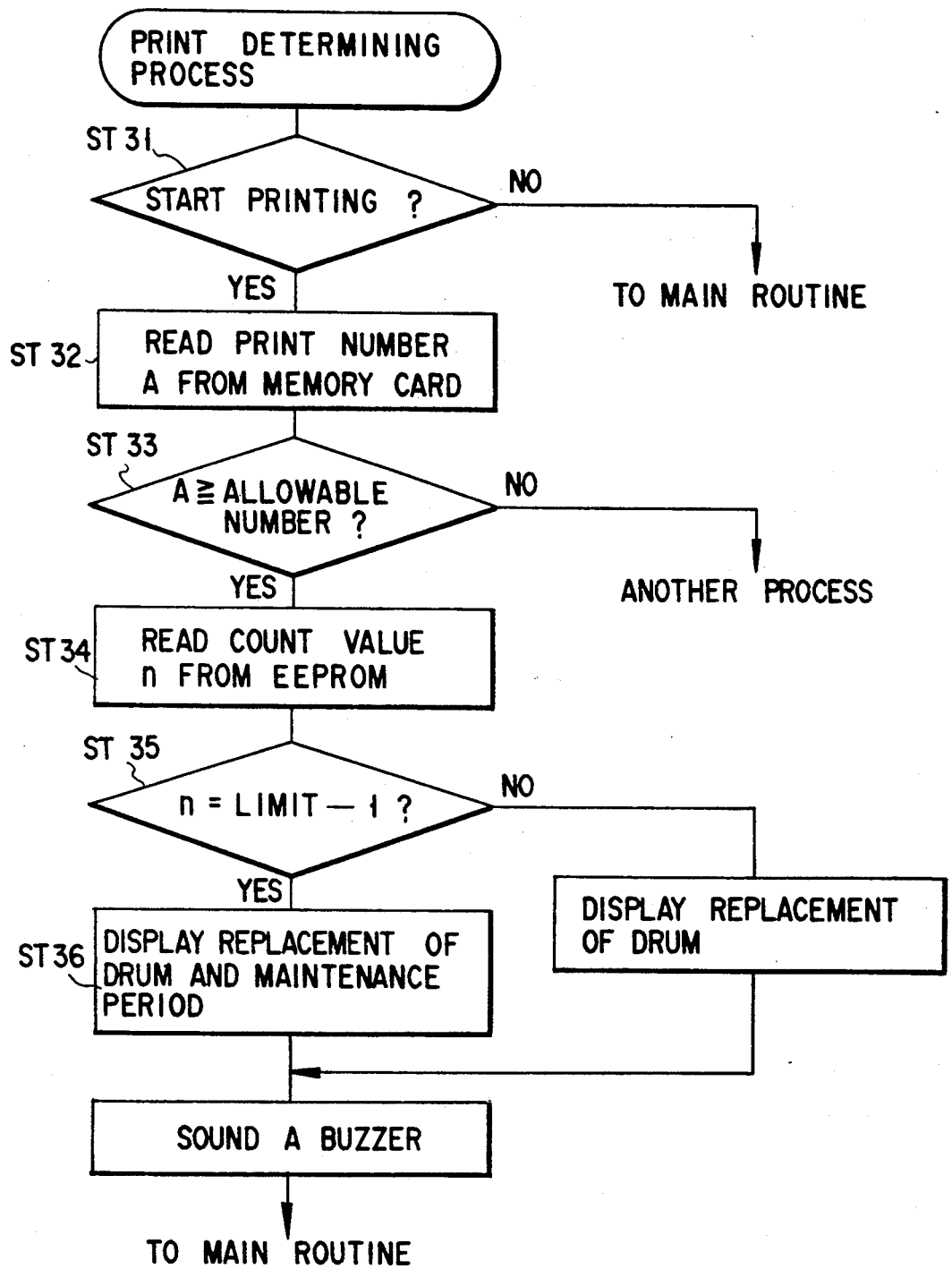
FIG. 5 is an another flowchart showing a print determining process of the CPU.

In the above embodiment, for example, an alarm sound is given indicating the need for inspection of the maintenance-requiring components when the replacement number of the memory card 26 has reached a predetermined limit number in a preprocess after power on. In this case, however, a user cannot be informed of the maintenance periods of the maintenance-requiring component until the photosensitive drum 2 and the memory card 26 are replaced and power is turned on. In the routine for the print determining process as shown in FIG. 5, therefore, a message indicating the need for the replacement of the photosensitive drum is displayed when the print number A read from the memory card 26 has reached the allowable sheet number. The CPU 21 is programmed so that, if the number of replacements of the memory card 26 stored in the EEPROM 25 is smaller than the limit number by one (ST35), but at this time a message indicating the need for the maintenance of the maintenance-requiring components is also displayed on the liquid crystal display 31. Accordingly, the user can recognize the maintenance periods of the maintenance-requiring components while the indicated replacement number is smaller than the limit number by one. It is therefore very convenient that the user can inspect the maintenance-requiring components as well as replace the photosensitive drum 2 with a new one.

Another electrophotographic apparatus is also considered which permits the replacements of the photosensitive drum 2 and the memory card 26 with power on. The printer cabinet 1 of this apparatus is opened with the upper and lower parts separated apart as done in the above-described embodiment before replacement of the photosensitive drum 2. This apparatus can therefore be programmed so as to perform the preprocess routine shown in FIG. 3 in the previous embodiment in accordance with a cabinet closing detection signal from the cover switch 17 in FIG. 1.

Further, an alarm sound generated by the buzzer 32 when the service life of the photosensitive drum 2 in use is expired may be distinguished from the one generated when the maintenance period for the other maintenance-requiring components has arrived in the above embodiment. This modification can eliminate the need to display the corresponding messages on the liquid crystal display 31. In addition, the informing of the arrival of those periods may be given only by a message display on the liquid crystal display 31, thus eliminating the need for an alarm sound from the buzzer 32.

Figure 6:
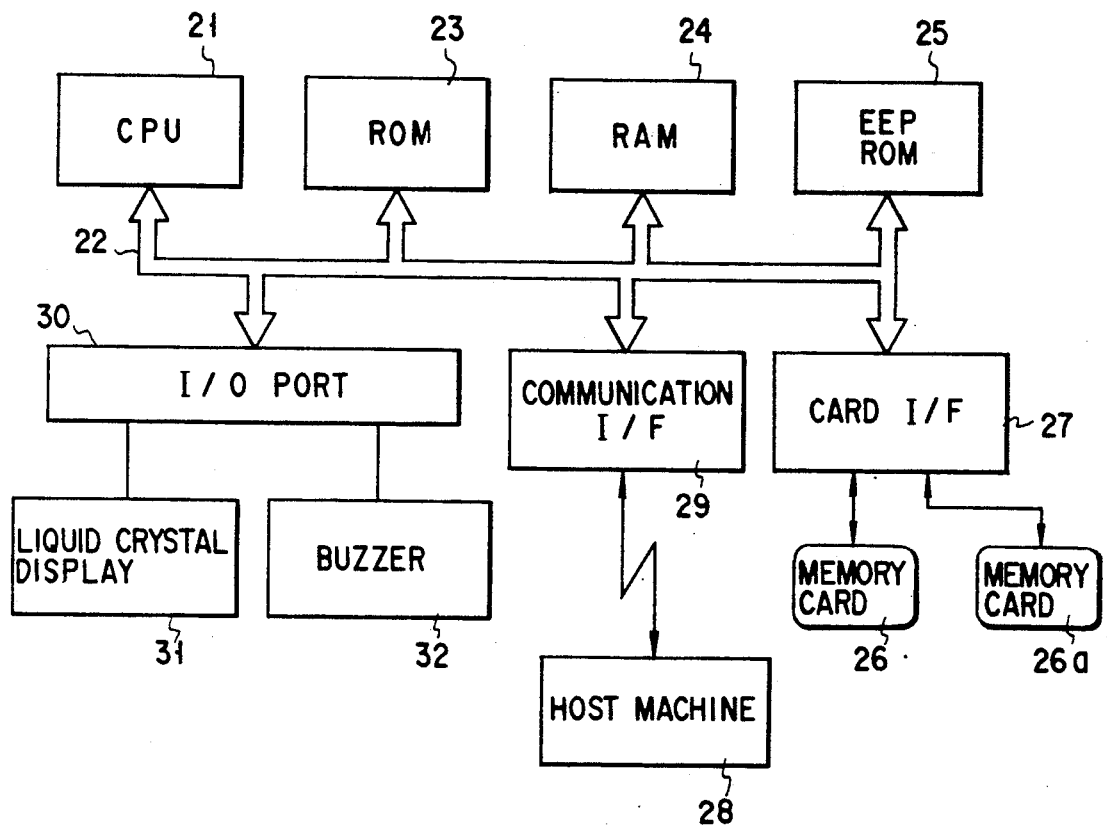
FIG. 6 is a block circuit diagram illustrating the circuit structure of another embodiment of the present invention.

After replacing or repairing the maintenance-requiring components as requested, a maintenance man has to reset the number of replacements of the memory card 26 which is stored in the EEPROM 25. As shown in FIG. 6, if the replacement number stored in the EEPROM 25 can be initialized by coupling a maintenance-purpose memory card 26a to the card interface 27, instead of the memory card 26 for counting print sheets, the maintenance work can be conveniently simplified. The same reference numerals as are used in FIG. 2 are given to corresponding or identical components in FIG. 6, and the explanation will not be given of those components in FIG. 6.

A preprocess performed by the CPU 21 after power is on is shown in FIG. 7. With power on, the CPU 21 determines the type of a memory card coupled to the interface 27 from information recorded on the card (ST41). If judging the card as the memory card 26 for counting the number prints (ST42), the CPU 21 executes the preprocess shown in FIG. 3, moving to the main routine.

If the installed memory card is the maintenance-purpose memory card 26a, the CPU 21 clears the contents of the address in the EEPROM 25 where the number of replacements of the memory card (replacement clearing means) to zero (ST43). The CPU 21 waits for the power to be turned off.

After replacing or repairing the maintenance-requiring components, the maintenance man installs the maintenance-purpose memory card 26 he carries to the card interface 27, and turns on the power. In this manner, the contents of the address in the EEPROM 25 where the number of replacements of the memory card is stored are cleared to zero. The maintenance man has only to temporarily turn off the power to install the memory card 26 for counting the number of prints instead of the maintenance-purpose memory card 26a, and then turn on the power again.

The present invention is not limited to the above-described embodiment, but also can be modified in various manners within the scope and spirit of this invention. For instance, this invention may be applied to a copy machine which operates along an electrophotographic process.

According to the embodiment as described above in detail, it is possible to provide an electrophotographic apparatus which has a simple and inexpensive structure to be able to automatically check the service lives of maintenance-requiring components that are longer than the service life of a photosensitive member and can thus prevent a malfunction of the electrophotographic apparatus due to the expiration of the service lives without troubling a user, thereby increasing the reliability of the electrophotographic apparatus.

A description will now be given of another embodiment, which utilizes first and second counters each constituted of a non-volatile memory element to inform that the number of image forming actions by a photosensitive member in use or the number of prints has reached a predetermined value and display the total number of prints since the beginning of printing when a report command is input, thereby facilitating the management of the maintenance periods of those components other than the photosensitive member which have relatively long service lives.

Figure 8:
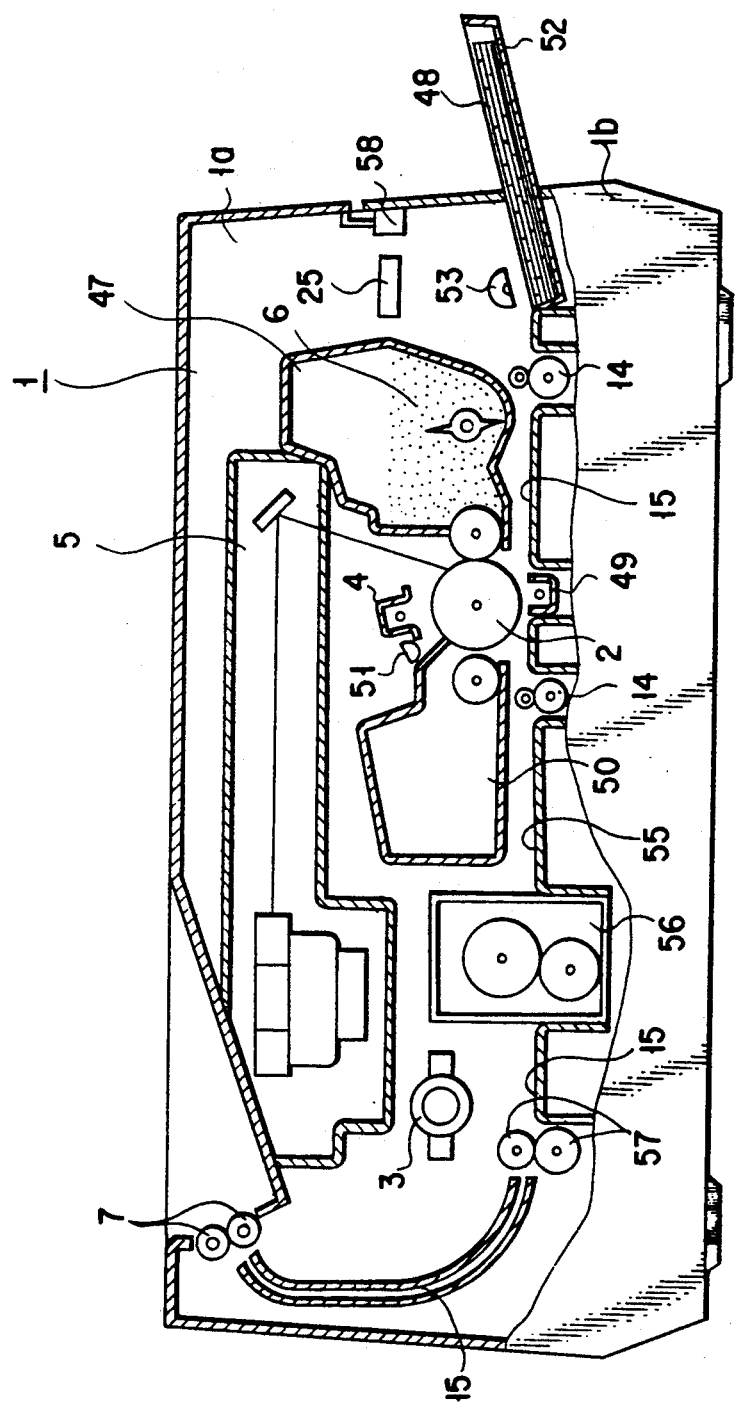
FIG. 8 is a schematic diagram illustrating the structure of a laser beam printer that is the target for maintenance by an apparatus for maintaining an electrophotographic apparatus according to the present invention.

FIG. 8 shows the arrangement of individual components of a laser beam printer as an electrophotographic apparatus. A photosensitive drum 2 is located almost in the center portion of a printer cabinet 1. The photosensitive drum (photosensitive member) 2 is rotated by a drive motor 3 in one direction, i.e., clockwise in FIG. 8. Arranged around the photosensitive drum 2 are an electrification charging section 4, an exposing section 5, a developing section 47, a transfer section 49, a cleaning section 50, and a deelectrification section 51 in the named order along an electrophotographic process. The electrification charging section 4 uniformly electrifies the surface of the photosensitive drum 2. The exposing section 5 radiates an information-controlled laser beam on the photosensitive drum 2, which has uniformly been electrified by the electrification charging section 4, and deelectrifies it according to information, forming an electrostatic latent image on the surface of the photosensitive drum 2. The developing section 47 puts a toner 6 as a developer on the electrostatic latent image on the photosensitive drum 2, formed by the exposure by the exposing section 5, to thereby develop the image as a toner image. The transfer section 49 transfers the toner image from the photosensitive drum 2 onto a sheet of paper that has been fed thereto. The cleaning section 40 cleans the residual toner off from the photosensitive drum 2. The deelectrification section 51 deelectrifies the charges remaining on the photosensitive drum 2.

The transfer section 49 is located below the photosensitive drum 2. Sheets of paper are picked up and fed out one by one from a paper supply cassette 52 provided on one side of the printer cabinet 1 toward the transfer section 49 by a pickup roller 11 in response to a sheet feed command, and is conveyed along a conveying path 55 by a pair of feed rollers 54.

After the transfer section 49 transfers the toner image from the photosensitive drum 2 onto the supplied sheet of paper, this toner image is fixed by a fixing section 56 and is then discharged from the top of the printer cabinet 1 by a pair of discharge rollers 57.

The printer cabinet 1 comprises an upper cover 1a and a lower cover 1b. At least one of the charging section 4, developing section 47, cleaning section 50 and deelectrifying section 51 is installed integrally in the photosensitive drum 2 via the support member of the photosensitive drum 2, so that it can be easily attached together with the photosensitive drum 2 to the lower cover 1b. Of the other components, those arranged above the conveying path 55 for the sheet 48 are installed in the upper cover 1a, and those located below the conveying path 55 in the lower cover 1b.

The upper cover 1a is designed freely openable and closable to the lower cover 1b, so that opening the upper cover 1a can permit the photosensitive drum 2 together with the component integrally provided therewith to be detached from the lower cover 1b. When the photosensitive drum 2 is removed, the conveying path 55 for the sheet 48 is exposed. A memory card (first counter) to be described later is detachably provided at one part of the lower cover 1b which is exposed when the upper cover 1a is open. A cover open switch 58 for detecting the opening of the upper cover 1a is provided at that portion of the lower cover 1b which comes in contact with and separate from the upper cove 1a.

The charging section 4, the exposing 5, the developing section 47, the transfer section 49, the cleaning section 50, the deelectrifying section 51 and the fixing section 56 are components which need replacement or maintenance work when a larger number of prints (about 80,000 prints) than the number of sheets printable (about 10,000 sheets) by one photosensitive drum 2.

Figure 9:
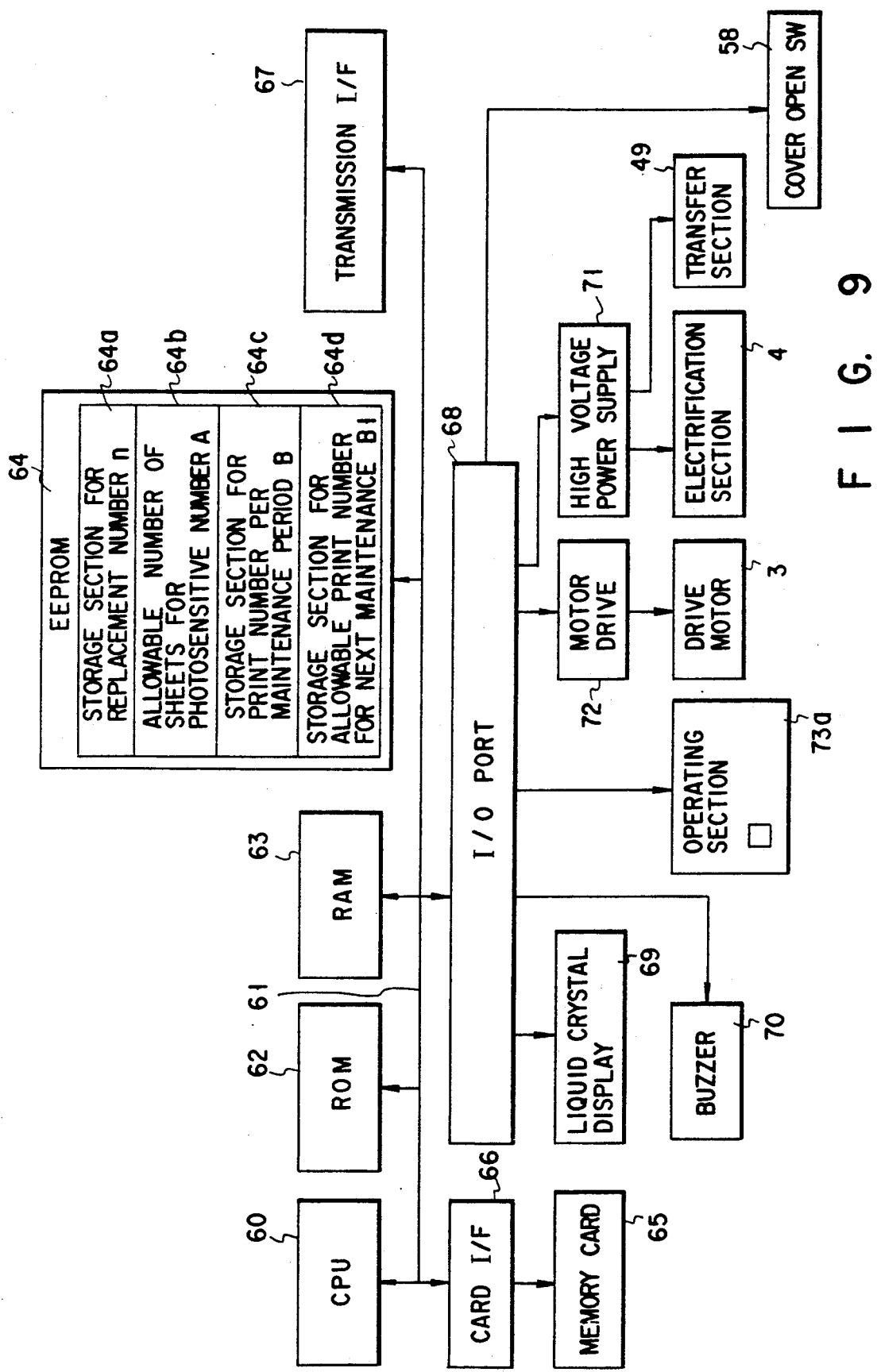
FIG. 9 is a block diagram illustrating the hardware structure of the essential portions of the apparatus for maintaining the laser beam printer shown in FIG. 8.

FIG. 9 presents a block diagram which illustrates the electric hardware structure of the above printer. A CPU (Central Processing Unit) 60, serving as a main control section, is connected to a ROM (Read Only Memory) 62, a RAM (Random Access Memory) 63, an EEPROM (Electrically Erasable and Programmable Read Only Memory; non-volatile memory element) 64, a card interface 66, a transmission interface 67 and an I/O port 68 by means of a bus line 61. The ROM 62 has program data, etc., stored previously. The RAM 63 provides a print buffer or the like for developing print data by image data. The EEPROM 64 serves to store various set values specific to a printer. The card interface 66 reads data from and writes data to a memory card 65 as a first counter, which is constituted of a non-volatile memory element to store the number of times image forming has been done. The transmission interface 6 exchanges data with a host machine (not shown).

Connected to the I/O port 68 are a liquid crystal display 69 for displaying various messages, etc., a buzzer 70 for informing the need for replacement of the photosensitive drum 2, a high voltage power supply circuit 71 for supplying a high voltage to the charging section 4 and transfer section 49, a motor drive circuit 72 for controlling the driving of the drive motor 3, an operating section 73 including a report command key 73a used to input a report command to instruct the display of the total number of prints and various other command keys, and the cover open switch 58.

The memory card 65 stores a count value N1 for the number of prints (the number of times images are formed) as information about the service life of the photosensitive drum 2, and is treated as a set with the photosensitive drum 2 so that the memory card 65 should also be at the time of replacing the photosensitive drum 2.

The reason why the memory card 65 is to be replaced together with the photosensitive drum 2 is that the replacement of the photosensitive drum 2 is judged by detecting the replacement of the memory card 65. An inexpensive EEPROM has a smaller allowable writing number (normally, 10,000 times or below), so that when it is used as a counter, the printable number of sheets is accumulated for several photosensitive drums 2, exceeding the printable number of sheets for a single photosensitive drum 2, the number of data writings exceeds the allowable writing number, making the count value unreliable. In general, therefore, the EEPROM cannot be used a counter that counts over 10,000 times, and should be replaced with the new one that can ensure 10,000 data writings, when it counted 10,000 times.

The EEPROM 64 is provided with a storage section 64a for replacement number which serves as a second counter to store a replacement number n of the memory card 65 as the number of the photosensitive drums 2 replaced, a storage section 64b for the allowable number of sheets for a photosensitive member, which stores an allowable sheet number A of the photosensitive member, a storage section 64c for the print number per maintenance period which stores a sheet number B that indicates a maintenance period when the total number of prints reaches the allowable sheet number A, and a storage section 64d for allowable print number for the next maintenance, which stores a sheet number B1 by which the sheet number B of the storage section 64c is updated to a value indicating the next maintenance period.

The control of the above-described printer when powered on will be described referring to the flowchart shown in FIG. 10.

When the printer is powered on, a predetermined initialization is performed (ST100), and data stored in the memory card 65 installed via the card interface 66, i.e., the print number N1 is read out (ST101). It is then determined whether or not the print number N1 is "0" (ST102). When N1 is not "0" (greater than "0"), it is not immediately after the replacement of the photosensitive drum 2, the current number of images formed that indicates the current use status of the photosensitive drum 2 is then compared with a predetermined value A (e.g., 10,000 sheets) corresponding to the predetermined allowable number of images formed by the photosensitive member (ST103). When the print number N1 is equal to or greater than the allowable number of times the photosensitive drum 2 is used, a message indicating the need for replacement of the photosensitive drum 2 is displayed on the liquid crystal display 69 and the used is informed of the same by a sound from the buzzer 70 (ST104). The steps ST101 to ST104 and the liquid crystal display 69 and buzzer 70 constitute informing means.

When the print number N1 is less than the allowable sheet number A of the photosensitive drum 2, which means that the replacement of the photosensitive drum 2 is not needed yet, the flow will advance to a printing process (ST112).

When the print number N1 is "0" in ST102, it is considered that the photosensitive drum 2 and memory card 65 have been replaced with new ones, stored data in the storage section 64a or the replacement number n of the photosensitive drum 2 counted after the previous maintenance work is read out (ST105), and the total number of prints N2 is computed based on the replacement number n and the predetermined value A (ST106). The relationship between those values is given by the following equation (1).

$$N2 = n \times A \qquad (1)$$

The stored data in the storage section 64a is incremented by "1" (ST107) for renewal of the stored data, and "1" is written in the memory card 65 to set the print number N1 to "1," which is a process indicating that the number of replacements is counted for the memory card 65 (ST108). This process is to inform the user of the counting having been completed, when the memory card 65 is inserted again after removed once in the case of paper jamming or the like.

Then, the result of the computation, N2, acquired in ST106, is compared with the predetermined value B stored in the storage section 64c (ST109). When N2>B, a message indicating that the maintenance period has arrived is displayed on the liquid crystal display 69 and the buzzer 70 is activated (ST110).

The predetermined value B1 stored in the storage section 64d is newly added to the predetermined value B stored in the storage section 64c at this time to update the predetermined value B in the storage section 64c to be the one indicating the next maintenance period (ST111). This value "B1" is the number of sheets printable by the next maintenance period after the previous period, and is thus a value corresponding to the number of prints that requires the next maintenance period if printing is done B1 times. Adding B1 to the predetermined value B in the storage section 64c, which indicates the next maintenance period for the other components, updates B to a value indicating the next maintenance period when the total number of prints N2 reaches B next time.

The user therefore knows that the maintenance for the other components than the photosensitive drum 2 is needed and can request the necessary maintenance work. When the total print number N2 has not reached the predetermined value B in ST109, the flow moves to the printing process (ST112).

Figure 11:
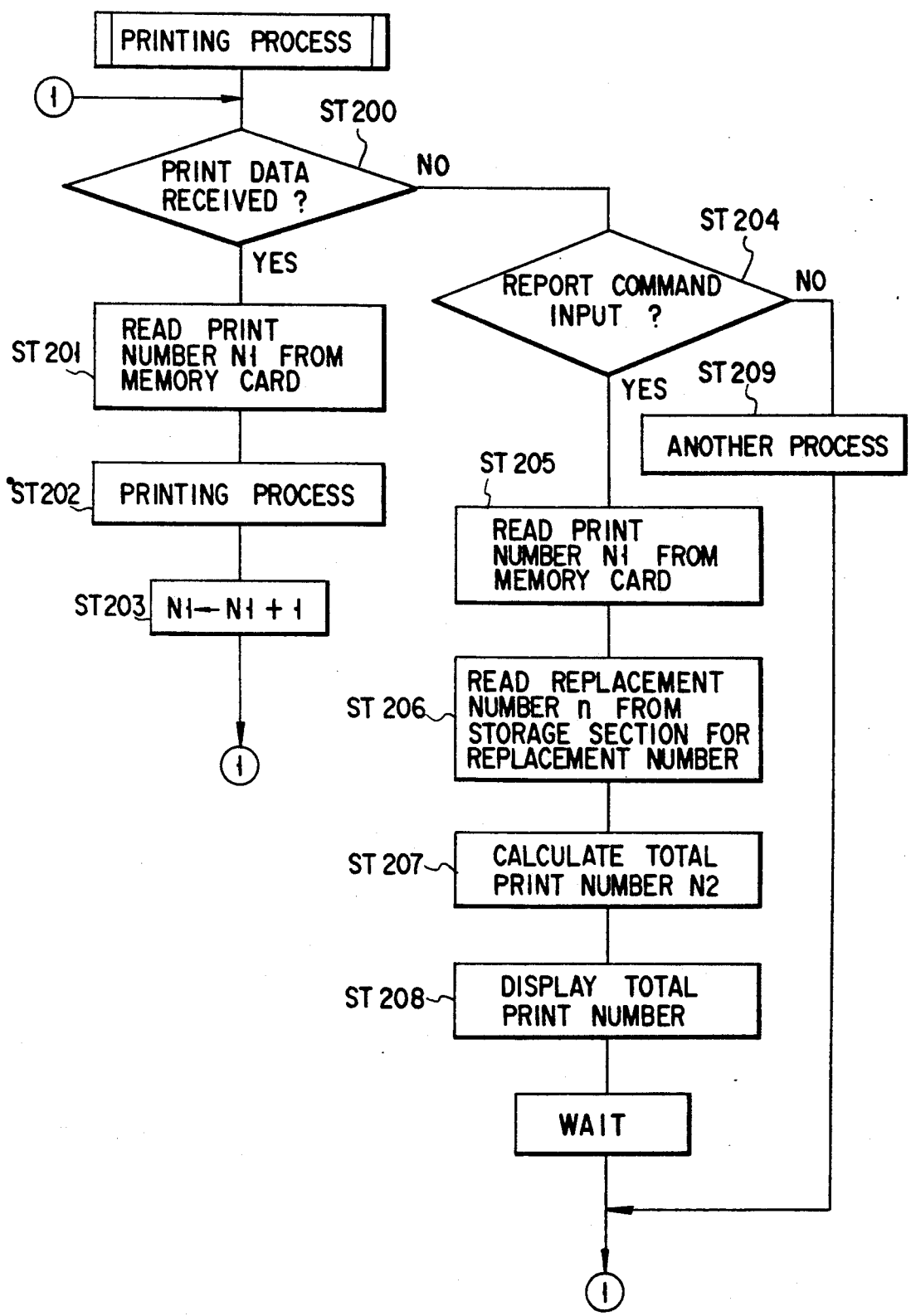
FIG. 11 is a flowchart showing a printing process of the laser beam printer shown in FIG. 8.

In the printing process shown in FIG. 11, the CPU 60 checks the transmission interface 67 to determine whether or not print data has been received (ST200). When the print data has been received, the stored data in the memory card 65 installed via the card interface 66 or the latest print number N1 is read out (ST201). The printing process is executed based on the received print data (ST202), and a value yielded by adding "1" to the latest print number N1 is written as a new print number N1 into the memory card 65 for its renewal (ST203).

When no print data has been received in ST200, it is determined if an instruction to display the total number of prints is given or a report command has been input (ST204). If the report command has been input, the stored data in the memory card 65 installed via the card interface 66 or the print number N1 is read out (ST205), and the replacement number n of the photosensitive drum 2 is read out from the storage section 64a (ST206) to compute the total print number N2 (ST207). This total print number N2 is displayed on the liquid crystal display 69 (ST208). The relationship between the total print number N2 and the read values is given by the following equation (2).

$$N2 = n \times A + N1 \qquad (2)$$

The steps ST205 to ST208 and the liquid crystal display 69 constitute display means.

When there is no print data received and no report command input, another process is to be executed (ST209). The above-described printing process is performed repeatedly.

Figure 12:
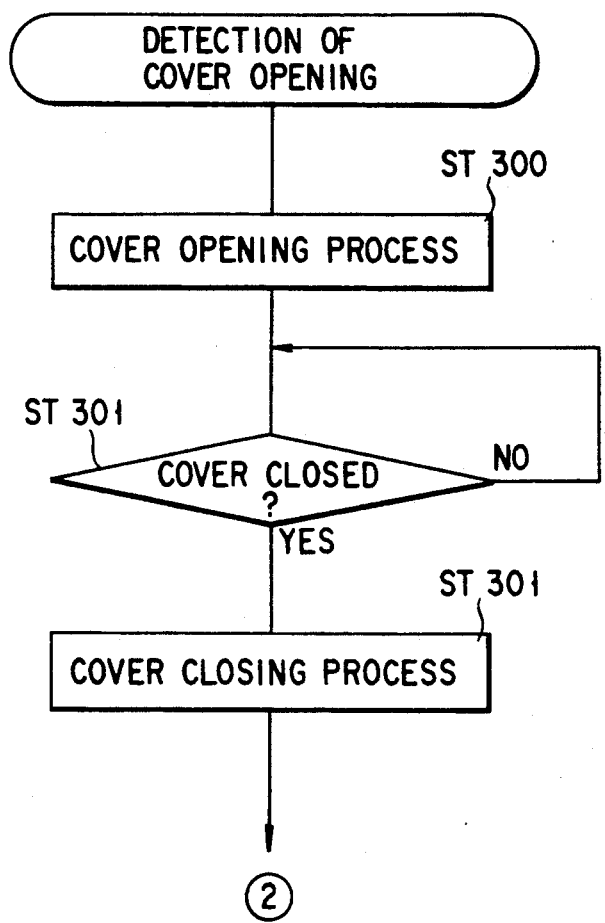
FIG. 12 is a flowchart showing a process when opening of the cover of the laser beam printer in FIG. 8 is detected.

The status of the cover open switch 58 that detects the open/close status of the upper cover 1a is checked for every proper steps in the printing process. When the opening of the cover 1a is detected, a flowchart given in FIG. 12 is executed.

First, a cover opening process to deactivate the heater of the fixing section 56 or inform the host machine of the upper cover 1a being open is executed (ST300), and then the CPU 60 waits for the upper cover 1a to be closed or checks the status of the cover open switch 58 until it detects the cover closed state (ST301). When the cover closed state is detected, the CPU 60 executes a cover closing process, such as informing the host machine that the cover open state has been cleared, (ST302), before starting executing the sequence of processes starting from step ST101 in the aforementioned power-on process.

Figure 10:
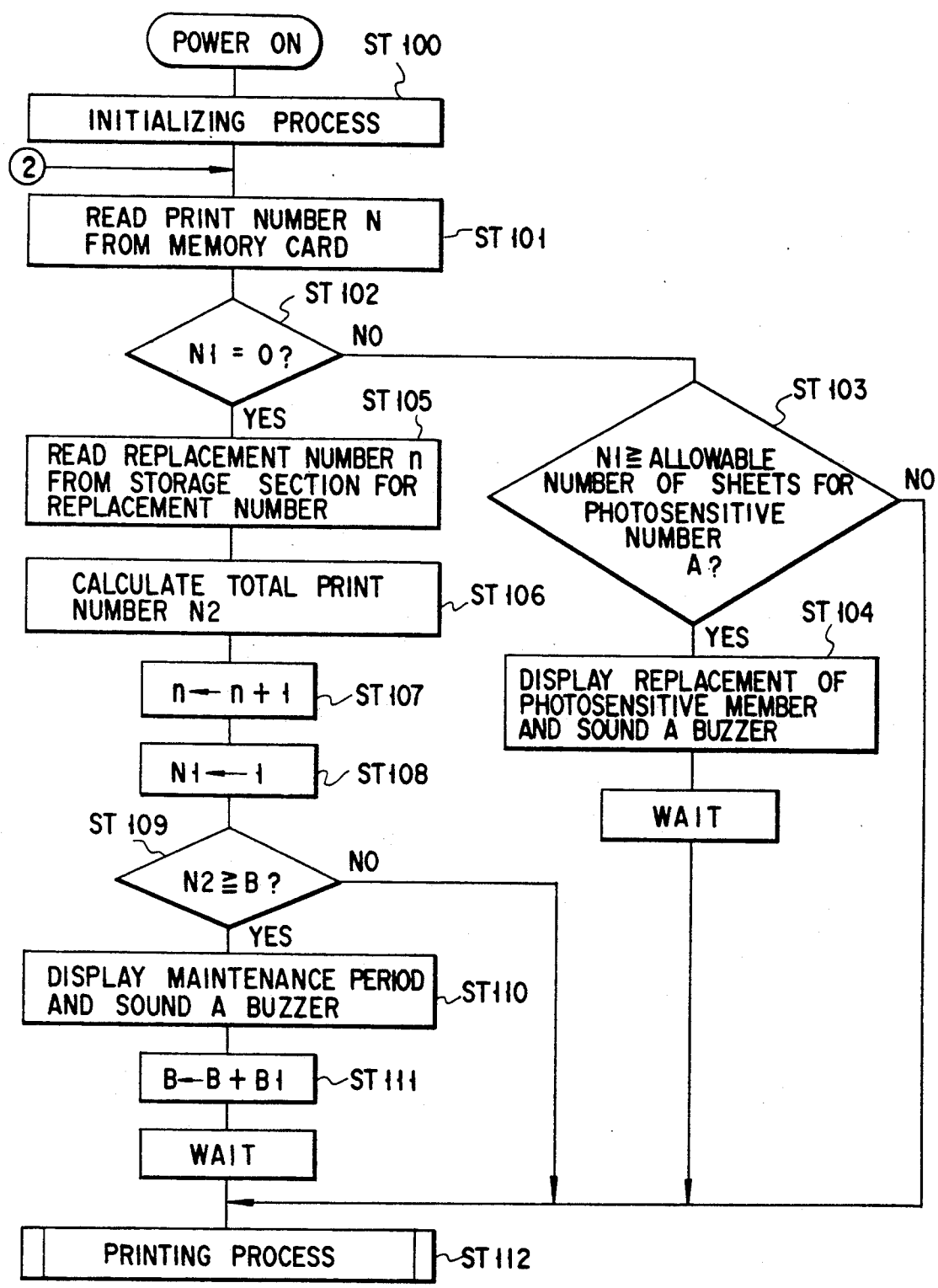

When the opening of the cover is detected, the sequence of processes from the step ST101 in the flow shown in FIG. 10 is executed when the cover is closed thereafter. Even if the memory card 65 is replaced with a new one with the power on, therefore, this replacement can always be detected.

According to this embodiment, as described above, when the photosensitive drum 2 has been used to make a predetermined number of prints so that it is the time for replacement of the photosensitive drum 2, it is possible to inform the user of the replacement period for the photosensitive drum 2 as well as of the maintenance periods for the other components that need maintenance whenever needed. Further, part of a non-volatile memory element that stores various pieces of set information is used as the replacement-number storage section 64a of the memory card 65 to count the number of times the photosensitive drums 2 are replaced, requiring no mechanical counter for this task. It is therefore possible to display the total number of prints since the first use of the printer as needed, permitting the user to easily know that total print number.

The present invention is not limited to the above-described embodiment. For instance, the report command may be input from a host machine. Further, the photosensitive drum 2 may be judged as having been replaced with a new one only when it is detected that the installment of the memory card 65, if detected uninstalled upon checking of its install status, is completed. Furthermore, an alarm sound generated by the buzzer 70 when the number of prints made by the photosensitive drum 2 in use has reached a predetermined value may be distinguished from the one generated when the maintenance period for the other maintenance-requiring components has arrived in the above embodiment. This modification can eliminate the need to display the corresponding messages on the liquid crystal display 69. In addition, the informing of the arrival of those periods may be given only by a message display on the liquid crystal display 69, thus eliminating the need for an alarm sound from the buzzer 70.

A predetermined value B for determining the maintenance periods of maintenance-requiring components may be provided for each such component (i.e., provision of multiple replacement-number storage sections 64a), allowing the user to be informed of different maintenance periods for different maintenance-requiring components.

As described in detail above, this embodiment can inform the user of the replacement period of a photosensitive member and the total number of image forming actions done by an electrophotographic apparatus with a simple and inexpensive arrangement, thus making it possible to provide a low-cost electrophotographic apparatus whose maintenance is easy.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An apparatus for maintaining an electrophotographic apparatus with at least a photosensitive member comprising:
   a central processing unit (CPU) which comprises a control section;
   memory means provided detachably for storing a count value for a number of prints;
   a rewritable non-volatile memory element for storing the number of replacements of said memory means when the count value for said number of prints has reached a value based on which a decision is made whether a service life of said photosensitive member is expired;
   memory-means replacement for counting means for updating a stored value in said non-volatile memory element and counting an updated value upon each replacement of said memory means;
   comparing means for comparing a count value of the replacement counting means with a predetermined value indicating a maintenance period of other components than said photosensitive member that need maintenance; and
   informing means for reporting the need for maintenance of said other components than said photosensitive member when it is judged that a value stored in said non-volatile memory element has reached said predetermined value.

2. An apparatus according to claim 1, wherein said informing means informs the need for maintenance of said other maintenance-requiring components than said photosensitive member when said value stored in said non-volatile memory element is a value indicating a number of replacements one before said predetermined value and when said count value for said number of prints stored in said memory means has reached a value based on which a decision is made whether said service life of said photosensitive member is expired.

3. An apparatus according to claim 1, further including means for inhibiting a print operation when said stored value of said memory means after replacement has reached a predetermined value after said count value of said memory-means replacement counting means has reached said predetermined value indicating said maintenance period of said other maintenance-requiring components than said photosensitive member.

4. An apparatus according to claim 1, further including means, connected to said CPU, for clearing contents of said memory-means replacement counting means to zero when installed in place of said memory means and power is turned on.

5. An apparatus for maintaining an electrophotographic apparatus with at least a photosensitive member having a latent image formed thereon based on print data, said latent image being developed by a developer to be a toner image which is then transferred onto a recording medium to form an image thereon, said apparatus comprising:
   a central processing unit (CPU) which comprises a control section;
   a read only memory (ROM), connected to said CPU via a bus line and having program data stored in advance;
   a random access memory (RAM) for providing a print buffer to develop print data by image data;
   an electrically erasable programmable ROM (EEPROM) for storing various set values inherent to a printer;
   first counter means connected to said CPU and to said EEPROM and including of a non-volatile memory element, provided detachably at a time of replacement of said photosensitive member, for counting a number of prints;
   second counter means including of said non-volatile memory element for updating a count value for said number of prints upon detection of an initial state of said first counter means;
   informing means, connected to said first counter means, for generating a sound when said counter means counts a count value equal to or greater than a predetermined value; and
   display means, connected to said CPU, and to said first and second counter means via an I/O port, for displaying a total number of prints according to a key input, based on said count value of said second counter means and said count value for said number of prints of said first counter means at a time said key input has been made.

* * * * *